United States Patent [19]

Jippo

[11] Patent Number: 4,872,166
[45] Date of Patent: Oct. 3, 1989

[54] INFORMATION PROCESSING SYSTEM CAPABLE OF REDUCING INVALID MEMORY OPERATIONS BY DETECTING AN ERROR IN A MAIN MEMORY

[75] Inventor: Akira Jippo, Tokyo, Japan

[73] Assignee: NEC Corporation, Tokyo, Japan

[21] Appl. No.: 94,582

[22] Filed: Sep. 9, 1987

[30] Foreign Application Priority Data

Sep. 10, 1986 [JP] Japan ................................ 61-214440

[51] Int. Cl.$^4$ ............................................. G06F 11/00
[52] U.S. Cl. .................................... 371/11.1; 371/10.1
[58] Field of Search ....................... 371/16, 21, 10, 11; 364/200, 900

[56] References Cited

U.S. PATENT DOCUMENTS

| | | | |
|---|---|---|---|
| 3,803,560 | 4/1974 | DeVoy et al. | 371/10 |
| 3,812,468 | 5/1974 | Wollum et al. | 371/11 |
| 4,010,450 | 3/1977 | Porter et al. | 371/21 |
| 4,058,851 | 11/1977 | Scheuneman | 371/10 |
| 4,456,993 | 6/1984 | Taniguchi et al. | 371/10 |

FOREIGN PATENT DOCUMENTS 0066147  12/1982  European Pat. Off. .............. 371/10

OTHER PUBLICATIONS

"How Computers Can Test Their Own Memories" by Goldblatt, Computer Design, vol. 15, No. 7, pp. 69–73, Jul. 1976.

Primary Examiner—A. D. Pellinen
Assistant Examiner—Geoffrey S. Evans
Attorney, Agent, or Firm—Foley & Lardner, Schwartz, Jeffery, Schwaab, Mack, Blumenthal & Evans

[57] ABSTRACT

In an information processing system for use in detecting an error in a main memory (11) comprising a plurality of memory units (111 to 118) and a common control section (19), an error detection signal and an error address are sent from a request source processor (15) to a diagnostic address generator (31) when an error is detected on an access operation of the request source processor. On diagnostic access operations, the diagnostic address generator successively produces a plurality of diagnostic addresses including the error address to receive diagnostic replies, each of which comprises a reply code. When an error of the main memory is indicated by the reply code, an error detection controller (32) discriminates the diagnostic address on occurrence of the error in the diagnostic operations to disconnect the memory unit or units from the main memory by the use of a memory restructuring circuit (36). All of the memory units are disconnected when a malfunction of the common control section is discriminated by the error detection controller.

6 Claims, 7 Drawing Sheets

| REPLY CODE | 0 | 1 | 2 | 3 | 4 | 5 | 6 |
|---|---|---|---|---|---|---|---|
| NORMAL REPLY | 1 | 0 | 0 | 0 | 0 | 0 | 0 |
| ABNORMAL REPLY 1 | 1 | 1 | 1 | 0 | 0 | 0 | 0 |
| ABNORMAL REPLY 2 | 1 | 1 | 0 | 1 | 0 | 0 | 0 |
| ABNORMAL REPLY 3 | 1 | 1 | 0 | 0 | 1 | 0 | 0 |

INFORMATION PROCESSING SYSTEM CAPABLE OF REDUCING INVALID MEMORY OPERATIONS BY DETECTING AN ERROR IN A MAIN MEMORY

BACKGROUND OF THE INVENTION

This invention relates to an information processing system which is capable of processing an error which might occur in a main memory. Although description will mainly be made about the information processing system comprising a plurality of processors, this invention is also applicable to a system comprising a single processor alone.

A conventional information processing system of the type described is disclosed by Wollum et al in U.S. Pat. No. 3,812,468 and is known as a multiprocessing system which comprises a plurality of processing groups. Each of the processing groups comprises a memory module and various kinds of processors, such as communication processors, I/O control units, a diagnostic logic processor, all of which are accessible to the memory module. When a malfunction occurs in units of the processing groups, as in the memory modules, a faulty one of the units is isolated or disconnected from the multiprocessing system with normal ones of the units left in the system. Under the circumstances, reconstruction or reconfiguration of the system is made by the use of the normal units. However, no consideration is made about partial disconnection of the memory module.

Recently, a very high speed computer system (so-called a super computer system) has been developed which can process a great number of data signals, such as vectors, at a high speed. In general, the super computer system is similar in structure to the multiprocessing system mentioned above and comprises a main memory, a plurality of processors, and an access control device between the main memory and the processors. The main memory comprises a plurality of memory units and a common control section operable to control the memory units in common.

With this structure, each of the processors is operable as a request source and accessible by an access operation to each of the memory units under control of the access control device through the common control section of the main memory. Such an access operation is carried out by specifying one of accesses consecutively assigned to the memory units of the main memory. In this event, a reply is returned back to the request source from the main memory.

When an error occurs in the reply obtained by accessing one of the addresses of the main memory, the reply is processed as an erroneous reply in the request source with the address in question kept in the request source as a faulty address. The faulty address is included in a faulty one of the memory units. Upon detection of the erroneous reply, the instruction under consideration is retried by the request source so as to access the faulty address again and to recover the error, if it is retriable. Thereafter, the faulty memory unit is disconnected or isolated with reference to the faulty address kept in the request source from the super computer system and reconstruction or restructure of the main memory is made by the use of the remaining memory units, when such an error is detected again as a result of the retry.

It is mentioned here that a fault or malfunction is not always restricted to the faulty memory unit but is often spread into any other memory unit or units. In other words, such a malfunction might be spread over a plurality of the memory units. However, the malfunction of the plurality of the memory units has not been detected in the super computer system.

In addition, an error detected by the request source may result from a malfunction of the common control section of the main memory. Under the circumstances, it is preferable to distinguish between a fault or malfunction of the memory unit or units and a fault or malfunction of the common control section. However, such distinction has never been made between the malfunction of the memory unit or units and the malfunction of the common control section in the above-mentioned super computer system.

Therefore, such a malfunction of the plurality of the memory units and/or the common control section must be detected at every access operation of each processor even after the reconstruction of the system. This shows that an error might take place from the malfunction of the plurality of the memory units or the common control section even after the system is restructured by detection of an error in a certain memory unit. As a result, an invalid or useless access operation has frequently been carried out in each of the processors, which brings about a useless reconstruction of the main memory. This is also true of a multiprocessing system as mentioned before.

SUMMARY OF THE INVENTION

It is an object of this invention to provide an information processing system which is capable of avoiding a useless access operation of each processor to a main memory and a useless reconstruction of the main memory.

It is another object of this invention to provide an information processing system of the type described, wherein it is possible to distinguish between a malfunction of a single memory unit included in the main memory and a malfunction of a plurality of memory units.

It is a further object of this invention to provide an information processing system of the type described, wherein distinction is also possible between the malfunction of the memory unit or units and a malfunction of a common control section included in the main memory.

An information processing system to which this invention is applicable comprises a main memory which has a plurality of addressed and which is accessible by a processor by an access operation carried out in the processor with a preselected address selected from the addresses during the access operation. The information processing system is operable to diagnose an error which might result in the main memory from the access operation. The processor comprises a detecting unit for detecting occurrence of the error to produce an error signal representative of the occurrence of the error and a memory address storage unit coupled to the detecting unit for memorizing the preselected address on the occurrence of the error. According to this invention, the information processing system comprises address producing unit operable on the occurrence of the error and coupled to the detecting unit and the memory address storage unit for producing not only the preselected address but as an additional address of the addresses that is diff from the preselected address to access both the preselected address and the additional address receiving unit for receiving results of accessing the preselected and the additional addresses, judging means coupled to the receiving for judging a faulty portion and a normal portion of the main memory in response to the access results to produce a result of judgment, and memory restructuring unit coupled to the judging means for restructuring the main memory in response to the result of judgment by isolating the faulty portion from the normal portion.

DESCRIPTION OF THE PREFERRED EMBODIMENT

Figure 1:
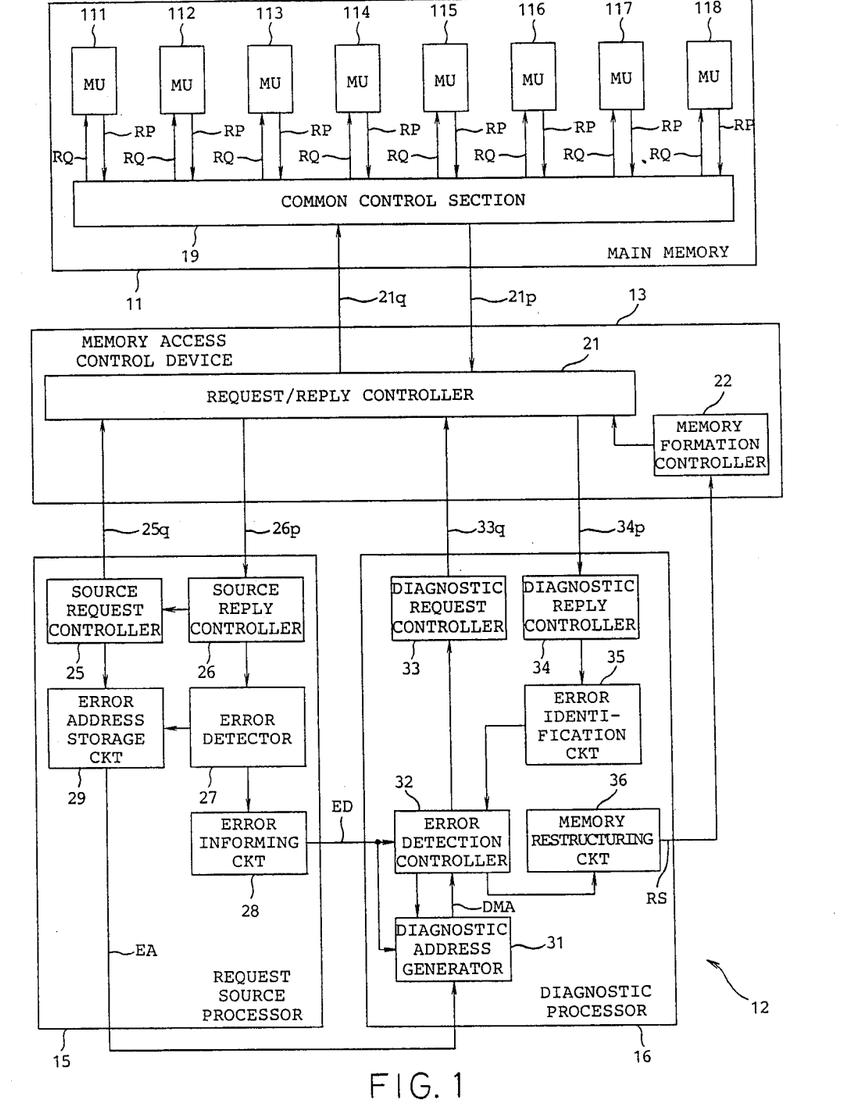
FIG. 1 is a block diagram of an information processing system according to a preferred embodiment of this invention.

Referring to FIG. 1, an information processing system according to a preferred embodiment of the invention comprises a main memory 11, a processor section 12, and a memory access control device 13 intermediate between the main memory 11 and the processor section 12.

The illustrated processor section 12 comprises a processor 15 operable as a request source processor and a diagnostic processor 16 for diagnosing a fault or malfunction which occurs in the information processing system.

The main memory 11 comprises first through eighth memory units (MU) 111 through 118 which are accessible independently of one another and a common control section 19 for controlling the memory units 111 to 118 in common. Each of the first through eighth memory units 111 to 118 may be implemented by a plurality of semiconductor chips. The common control section 19 may be called a main memory control section and is operable to deliver request signals RQ to the respective memory units 111 to 118 and to receive reply signals RP from the respective memory units 111 to 118.

It is assumed that each of the request signals RQ includes a request indication, a request address signal, and a request data signal while each of the reply signal RP includes a reply indication, a reply code signal, and a reply data signal. Anyway, each of the request and the reply signals collectively represents signals necessary for a request and a reply operation.

The memory access control device 13 comprises a request/reply controller 21 connected to the common control section 19 of the main memory 11 through a request line 21q and a reply line 21p for intermediate request and intermediate reply signals which are somewhat different from the above-mentioned request and the reply signals RQ and RP, respectively. A memory formation controller 22 is included in the memory access control device 13 and is connected to the request/reply controller 21 and to the diagnostic controller 16. The memory formation controller 22 serves to control a formation of the memory units 111 to 118 in cooperation with the diagnostic processor 16 in a manner to be described later.

In FIG. 1, the request source processor 15 comprises a source request controller 25 connected to the request/reply controller 21 of the memory access control device 13 through a local request line 25q for a local request signal of the request source processor 15. The source request controller 25 serves to control the local request signal sent to the memory access control device 13. In other words, the source request controller 25 carries out a memory access operation. In this event, a request address signal indicates a preselected address which is present in a preselected one of the memory units 111 to 118. A source reply controller 26 is connected to the request/reply controller 21 through a local reply line 26p and to the source request controller 25. The source reply controller 26 serves to control a local reply signal which is sent from the request/reply controller 21 in relation to the memory access operation with a reply code accompanied therewith.

An error detector 27 is supplied with the reply code of the local reply signal through the source reply controller 26 to detect whether or not an error is indicated by the reply code. The error detector 27 informs an error informing circuit 28 of occurrence of the error when the error is indicated by the reply code and makes the error informing circuit 28 produce an error detection signal ED representative of occurrence of the error. A combination of the error detector 27 and the error informing circuit 28 may collectively be called a detection circuit for detecting occurrence of an error. In this event, the error detector 27 enables an error address storage circuit 29 to make the same store the preselected address related to the error. The preselected address is thus stored in the error address storage circuit 29 as an error address produced in the form of an error address signal EA.

The diagnostic processor 16 is operable in response to the error detection signal ED and the error address signal EA which are sent from the error informing circuit 28 and the error address storage circuit 29 on detection of the error in the request source processor 15, respectively. More particularly, the diagnostic processor 16 comprises a diagnostic memory address generator 31 coupled to the error informing circuit 28 and the error address storage circuit 29 in addition to an error detection controller 32 coupled to the error informing circuit 28. The diagnostic memory address generator 31 is also coupled to the error detection controller 32 and supplies the error detection controller 32 with a plurality of diagnostic addresses including the error address under control of the error detection 32, as will later be described in detail.

The error detection controller 32 is supplied with the error detection signal ED and is operable in cooperation with a diagnostic request controller 33. The diagnostic request controller 33 is connected to the request/reply controller 21 through a diagnostic request line 33q and controls a memory access request, namely, a diagnostic request of the diagnostic processor 16. The diagnostic request controller 33 thus serves to access the main memory 11 and to allow the diagnostic addresses to pass therethrough. Therefore, the diagnostic request controller 33 cooperates with the diagnostic address generator 31 to produce the plurality of the diagnostic addresses. As a result of memory access, a memory access reply, namely, a diagnostic reply is sent from the main memory 11 to a diagnostic reply controller 34 through the memory access control device 13 and a diagnostic reply line 34p. The diagnostic reply controller 34 receives and controls the memory access reply to supply a reply code of the memory access reply to an error identification circuit 35. The error identification circuit 35 identifies an error with reference to the reply code to check a cause of the error. Such an error may be called a diagnostic error. Specifically, the error identification circuit 35 detects whether the diagnostic error results either from a malfunction of the main memory 11 or from a malfunction of the memory access control device 13 and the request source processor 15 in a manner to be described later.

The error identification circuit 35 puts the error detection controller 32 into operation when the diagnostic error results from the malfunction of the main memory 11. The error detection controller 32 makes the diagnostic address generator 31 produce the plurality of the diagnostic addresses with reference to the error address signal EA so as to carry out diagnostic access operations.

In this event, the diagnostic addresses are delivered in the form of diagnostic address signals DMA from the diagnostic address generator 31 through the error detection controller 32 and the diagnostic request controller 33 to the main memory 11. As a result, diagnostic replies are sent from the main memory 11 back to the error detection controller 32 through the diagnostic reply controller 34 and the error identification circuit 35. The error detection controller 32 makes diagnosis of the diagnostic replies to produce results of diagnosis in regard to the diagnostic addresses.

A memory restructuring circuit 36 is operable in response to the results of diagnosis to disconnect a faulty one or ones of the memory units 111 to 118 from a normal one or ones of the memory units 111 to 118. In other words, the memory restructuring circuit 36 serves to produce a restructuring control signal RS for restructuring the memory units of the main memory 11 with reference to the result of diagnosis. Responsive to the restructuring control signal RS, the memory formation controller 22 indicates the formation of active memory units.

Now, description will be made about a normal operation of the illustrated information processing system. In this event, no error is detected by the error detector 27 and the diagnostic processor 16 is kept inactive.

Let a readout operation be requested by the request source processor 15 as the access operation. In the request source processor 15, the local request signal is issued from the source request controller 25 through the local request line 25q to the request/reply controller 21. The local request signal includes a readout request signal indicative of a readout request, a memory address signal specifying a memory address, and a request code, along with a request indication. The request indication specifies the access operation of the request source processor 15. The readout request signal may be included in the request code.

The request/reply controller 21 at first checks whether or not the request indication in question conflicts with the other request indications issued from the other request source processors (not shown). Subsequently, the request/reply controller 21 sends the intermediate request signal to the common control section 21 through the request line 21q in consideration of the formation of the memory units 111 to 118, the readout request, and the memory address. The memory address signal of the local request signal indicates the preselected address present in the preselected memory unit which is, for example, the second memory unit 11.

The common control section 19 delivers the request signal RQ to the preselected memory unit, for example, 112 to carry out the readout operation. A readout data signal is read as a reply data signal out of the preselected address of the preselected memory unit and is supplied to the common control section 19 which can form a reply code.

The reply code includes information indicative the presence or absence of an error related to the access operation, and location information indicative of a location of the error. The location information indicates that the error takes place at either one of the main memory 11, the memory access control device 13, and the request source processor 15. In other words, the location information indicates where the error takes place in the main memory 11. Thereafter, the reply data signal and the reply code are sent as the intermediate reply signal to the source reply controller 26 of the request source processor 15 through the local reply line 26p under the control of the request/reply controller 21.

When no error is detected in the error detector 27, the normal operation is continuously executed in the request source processor 15.

Description will be directed to the operation which is carried out when an error is detected in the error detector 27. Like in the normal operation, the readout operation is assumed to be made as access operation by indicating the preselected address present in the present memory unit 111 to 118.

When the local request signal is produced by the source request controller 25, the local reply signal is returned back to the source reply controller 26 through the local reply line 26p in the above-mentioned manner. The reply code of the reply signal is delivered from the source reply controller 26 to the error detector 27. When the error detector 27 detects an error resulting from a malfunction of the main memory 11, the error informing circuit 28 which is coupled to the source reply controller 26 sends the error detection signal ED to both the diagnostic address generator 31 and the error detection controller 32 of the diagnostic processor 16. Simultaneously, the error address storage circuit 29 is enabled by the error detector 27 to store the preselected address. Thereafter, the stored preselected address is supplied as the error address signal EA to the diagnostic address generator 31.

Responsive to the error detection signal ED and the error address signal EA, the diagnostic address generator 31 automatically produces a plurality of the diagnostic addresses with reference to the error address. The diagnostic addresses include the error address and serve to judge that the error results either from a malfunction of any of the memory units or from the common control section 19. For example, the diagnostic addresses are composed of the error address, a pair of additional addresses spaced apart from the error address EA by ±1 kB (kilobytes), and another pair of subsidiary addresses spaced apart from the error address EA by ±3 kB (kilobytes). At any rate, five of diagnostic the addresses specify memory addresses assigned to different ones of the memory units 111 to 118 and are successively sent from the diagnostic address generator 31 as the diagnostic address signals DMA to the diagnostic request controller 33 through the error detection controller 32.

In this event, the error detection controller 32 supplies the diagnostic request controller 33 with a memory access indication of accessing the diagnostic addresses produced by the diagnostic address generator 31. Under the circumstances, the diagnostic request controller 33 successively carries out the diagnostic access operations to the main memory 11 by the use of the diagnostic address. In the above-mentioned example, the diagnostic access operations are carried out five times in connection with the five diagnostic addresses. As a result, the local reply signals are returned back to the diagnostic reply processor 34 five times. Each reply code of the local reply signals is delivered from the diagnostic reply controller 34 to the error identification circuit 35. The error identification circuit 35 detects the presence or absence of an error in the main memory 11 and produces results of detection for the five diagnostic addresses. On upon the detection of presence of an error in the main memory 11, the error detection controller 32 is enabled in response to the results of detection to judge where the error occurs in the main memory 11. In other words, the error detection controller 31 judges whether results from a malfunction of the memory unit or units, or from the common control section 19.

For example, judgment is made as regards an occurrence of an intermittent error by the error detection controller 32 when the diagnostic access operations are all normally completed. This shows that any error intermittently and accidentally occurs in the preselected address for some reason and may be recovered. However, such an error might recur in the preselected address. Taking this into account, the preselected memory unit to which the preselected address belongs is regarded as being faulty by the illustrated error detection controller 32. The error detection controller 32 thus informs the memory restructuring circuit 36 of the occurrence of the error in the preselected memory unit.

The memory restructuring circuit 36 supplies the memory formation controller 22 with the restructuring control signal RS indicative of disconnection of the preselected memory unit from the main memory 11. Responsive to the instructing control signal RS, the memory formation controller 22 restructures the memory units by disconnecting the preselected memory unit from the main memory 11.

On the other hand, it is assumed that the error identification circuit 35 detects errors in the preselected address and the additional addresses spaced apart by ±1 kB from the preselected address, with no error detected in the subsidiary addresses spaced apart from ±3 kB. In this case, the preselected memory unit and two memory units adjacent the preselected memory unit on both sides thereof are judged as being faulty by the error detection controller 32.

When all of the memory access operations are erroneously completed, the error identification circuit 35 judges the common control section 19 as being faulty.

The number of the diagnostic addresses and the address intervals between the diagnostic addresses have a case relation to the number of the memory units and a memory capacity of each memory unit and may be varied in each system in consideration of the number of the memory units and the memory capacity. It is possible to change a judgment operation of judging a faulty one or ones of the memory units in response to the diagnostic addresses in dependency upon a method of controlling the main memory 11. For example, only the error address and a single additional address may be used as the diagnostic addresses.

Figure 2:
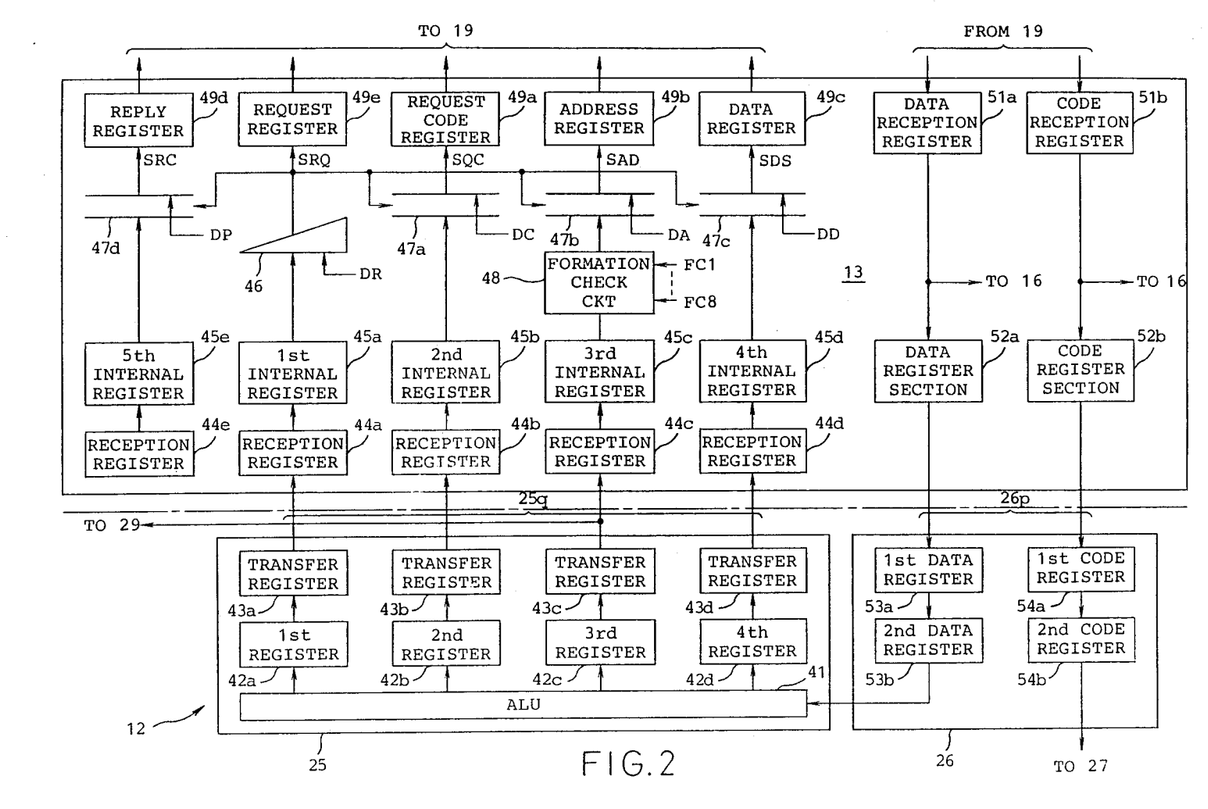
FIG. 2 is a partial block diagram of a request source processor and a memory access control device both of which are used in the information processing system illustrated in FIG. 1.

Referring to FIG. 2, detailed description will be made about a relationship between the memory access control device 13 and the source request processor 15. In FIG. 2, the source request controller 15 and the source reply controller 16 of the request source processor 12 are illustrated together with the request/reply controller 21 of the memory access control device 13.

The source controller 15 is operable in response to each of the instructions read out of the main memory 11 (FIG. 1). Specifically, the source request controller 15 comprises an arithmetic logical unit (ALU) 41 operable in accordance with each instruction to produce a result of operation. As regards the memory access operation, the arithmetic logical unit 41 delivers a request indication representative of a request, a request code, an address signal, and a data signal through first, second, third, and fourth registers 42a, 42b, 42c, and 42d to the first through fourth transfer registers 43a, 43b, 43c, and 43d which are connected to the request/reply controller 21. The address signal is also delivered t the error address storage circuit 29 (FIG. 1) from the third transfer register 43c. The request code may carry a readout request or a write-in request.

In the request/reply controller 21, the request indication, the request code, the address signal, and the data signal are received by first through fourth reception registers 44a, 44b, 44d, and 44d and sent to first through fourth internal registers 45a, 45b, 45c, and 45d, respectively. The request/reply controller 21 produces a reply code in response to the received request in a known manner. The reply code is stored in a fifth reception register 44e and is sent to a fifth internal register 45e. The reply code may be sent back to the request/reply controller 21 from the common control section 19.

The request indication is delivered from the first internal register 45a to a priority detector 46 to which a diagnostic request DR is also delivered from the diagnostic processor 16. The request indication from the request source processor 15 may be called a normal request so as to distinguish from a diagnostic request issued from the diagnostic processor 16. The priority detector 46 detects a degree of priority to produce a selected request SRQ. The selected request SRQ is delivered from the priority detector 46 to first through fourth selectors 47a through 47d which are operable in the following manner.

The second, the fourth, and the fifth internal registers 45b, 45d, and 45e are coupled to the first, the third, and the fourth selectors 47a, 47c, and 47d, respectively, while the third internal register 45c is coupled to the second selector 47b through a formation check circuit 48 connected to the memory formation controller 22 (FIG. 1).

The formation check circuit 48 is supplied from the memory formation controller 22 with first through eighth formation control signals FC1 to FC8 which are representative of either validity or invalidity of the first through eighth memory units 111 to 118, respectively. The formation check circuit 48 checks whether or not the address signal specifies a valid one of the addresses. If the address signal specifies an invalid one of the addresses, the formation check circuit 48 processes the request in question as a faulty request and makes the reply code include an indication of the faulty request in a known manner. Thus, the reply code carries an error detected in the request/reply controller 21.

The first through fourth selectors 47a to 47d are also supplied from the diagnostic processor 16 (FIG. 1) with a diagnostic request code DC, a diagnostic address signal DA, a diagnostic data signal DD, and a diagnostic reply code DP, respectively. At any rate, the first through fourth selectors 47a to 47d are operated in response to the selected request SRQ and send a selected request code SQC, a selected address signal SAD, a selected data signal SDS, and a selected reply code SRC to a request code register 49a, an address register 49b, a data register 49c, and a reply register 49d, respectively. The selected request signal SRQ is also sent from the priority detector 46 to a request register 49e. As a result, the selected request signal SRQ, the selected request code SQC, the selected address signal SAD, and the selected data signal SDS are sent to the common control section 19 of the main memory 11 to receive the reply code sent back from the main memory 11 and a reply data signal given from the main memory 11.

The reply code and the reply data signal are received by a code reception register 51a and a data reception register 51b, respectively, and are delivered to the source reply controller 26 through a data register section 52a and a code register section 52b, respectively. In the diagnostic processor 16, the reply data signal is sent through first and second data registers 53a and 53b to the arithmetic logical unit 41 while the reply code is sent through first and second code registers 54a and 54b to the error detector 27.

Figure 3:
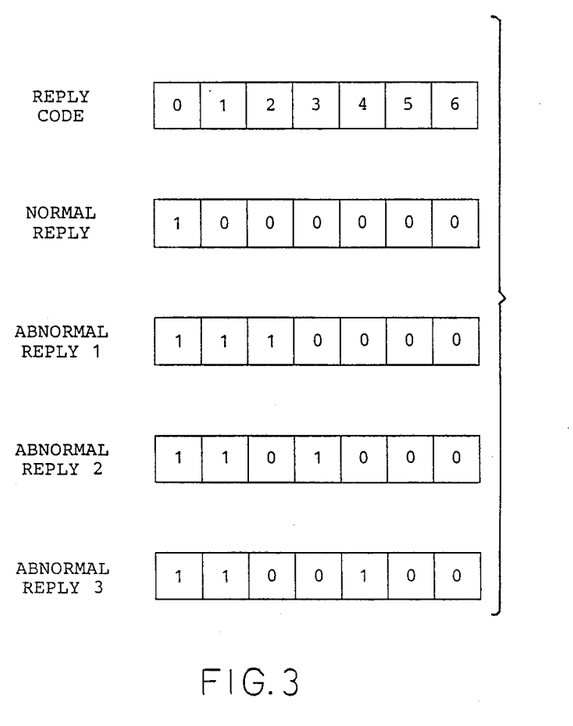
FIG. 3 is a signal format for describing a reply code used in the information processing system illustrated in FIG. 1.

Referring to FIG. 3, a reply code is exemplified which is used in the information processing unit illustrated in FIGS. 1 and 2. The reply code is produced by the common control section 19 (FIG. 1) and is composed of zeroth through sixth bits depicted at 0, 1, ..., and 6, respectively, as shown along a first line logic "1" level on production of a reply and takes a logic "0" level on production of a request. The second through fourth bits 2, 3, and 4 have the logic "1" levels when errors are detected at the main memory 11, the memory access control device 13, and the request source processor 15, respectively. The first bit represents a result of logical OR of the second through fourth bits. The fifth and the sixth bits 5 and 6 are indicative of an address number assigned to each of the request source processor 15 and the diagnostic processor 16.

It is assumed that the request source processor 15 has a preassigned address number of "00" and issues a request to the main memory 11 and that a normal reply is returned back to the request source processor 15. In this event, the normal reply has a pattern of "1000000", as shown along a second line in FIG. 3.

When an error is detected in the main memory 11, the memory access control device 13, and the request source processor 15, abnormal replies 1, 2, and 3 are produced, as shown along third through fifth lines, respectively.

Figure 4:
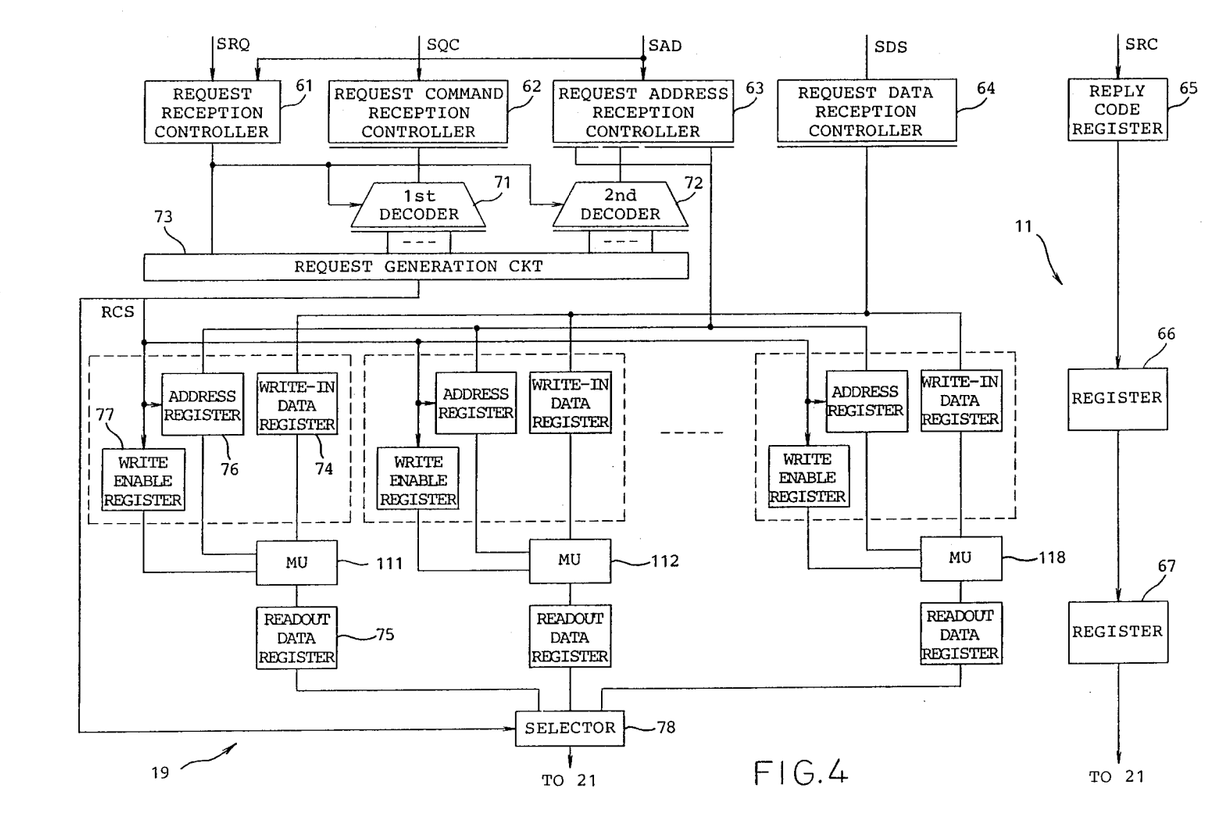
FIG. 4 is a block diagram of a main memory included in the information processing system illustrated in FIG. 1.

Referring to FIG. 4, the common control section 19 is illustrated in detail together with the first through eighth memory units 111 to 118. The common control section 19 is supplied as the request signal RQ (FIG. 1) with the selected request SRQ, the selected request code signal SQC, the selected address signal SAD, the selected data signal SDS, and the selected reply code SRC through the registers 49e and 49a to 49d (FIG. 2), respectively. The selected request SRQ and the selected address signal SAD are sent to a request reception controller 61. In addition, the selected request code signal SQC, the selected address signal SAD, and the selected data signal SDS are sent to a request command reception controller 62, a request address reception controller 63, and a request data reception controller 64, respectively.

The selected reply code SRC is stored in a reply code register 65 and is carried through a pair of registers 66 and 67 back to the request/reply controller 21 (FIG. 1).

On the other hand, a first decoder 71 is coupled to the request reception controller 61 and the request command reception controller 62 to decode the selected request code SQC into a decoded request code while a second decoder 72 is coupled to the request reception controller 61 and the request address reception controller 63 to decode a part of the selected address signal into a unit address signal specifying either one of the memory units 111 to 118. The decoded request code and the unit address signal are supplied to a request generation circuit 73 to be produced as request control signals RCS which specify the respective memory units 111 to 118. Each of the memory units 111 to 118 is accessed by the use of a register circuit similar in structure and operation to those illustrated in the remaining memory units. In this connection, description will be made only about the register circuit of the first memory unit 111.

The register circuit comprises a write-in data register 74 coupled to the request data reception controller 64, a readout data register 75 supplied with a readout data signal, an address register 76 coupled to the request address reception controller 64, and the request generation circuit 73, and a write enable register 77 coupled to the request generation circuit 73. The readout data signal is sent to the request/reply controller 21 (FIG. 1) through a selector 78 controlled by the request control signal RCS. The circuits and controllers illustrated in FIG. 4 may be implemented by known circuit elements and will therefore not be described any longer.

Figure 5:
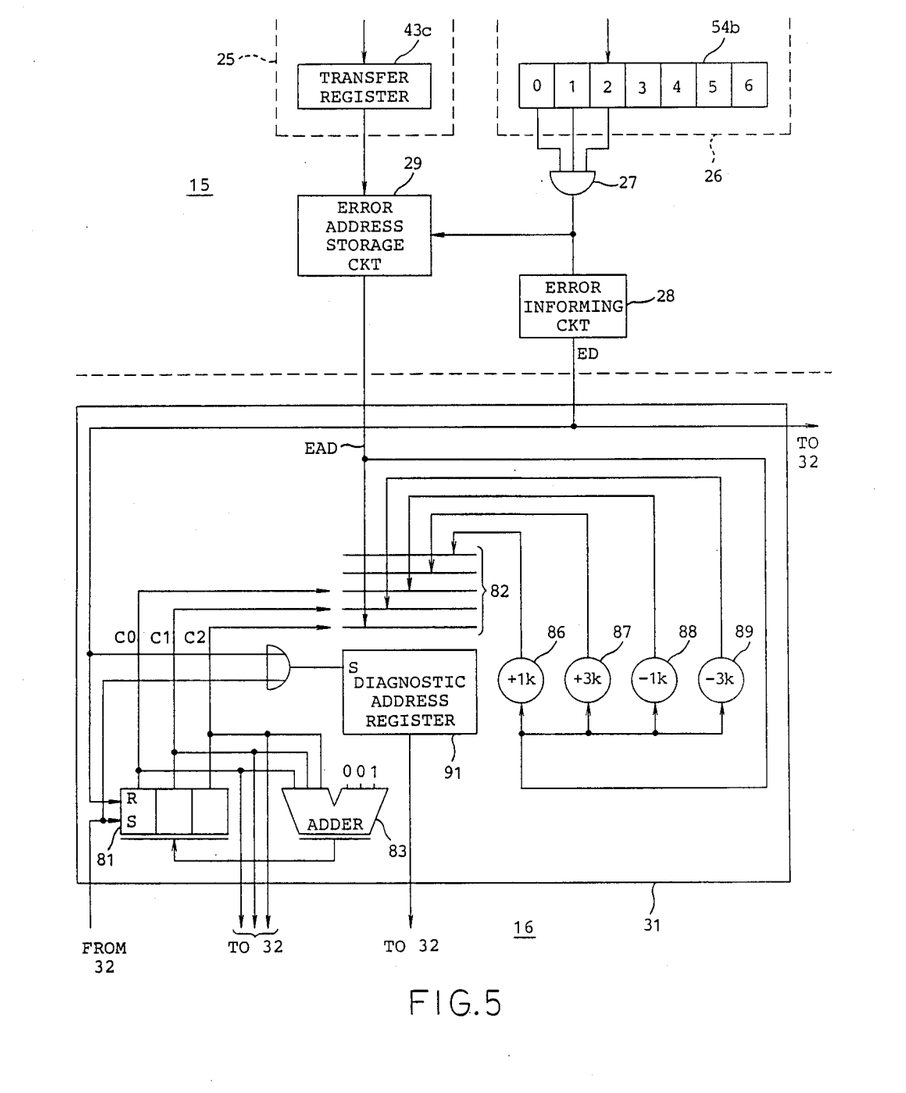
FIG. 5 is a block diagram of a part of a diagnostic processor illustrated in FIG. 1.

Referring to FIG. 5, the diagnostic address generator 31 of the diagnostic processor 16 is illustrated in detail along with the error address storage circuit 29, the error detector 27, and the error informing circuit 28, which are all included in the request source processor 15. In FIG. 5, the error detector 27 is implemented by an AND gate to which the zeroth through second bits of the reply code are supplied from the second code register 54b. From this fact, it is readily understood that the AND gate produces a logic "1" level signal to indicate occurrence of an error when the zeroth through second bits all take the logic "1" level. The logic "1" level signal shows that the error occurs in the main memory 11, as is seen from FIG. 3.

Responsive to the logic "1" level signal, the error address register 29 stores an error address as an error address signal EAD kept therein. The logic "1" level signal is also delivered from the error detector 27 to the error informing circuit 28 to be sent as the error detection signal ED to the diagnostic address generator 31 and the error detection controller 32 (not shown in FIG. 5). Thus, the diagnostic address generator 31 is supplied with the error address signal depicted at EAD and the error detection signal ED.

The illustrated diagnostic address generator 31 comprises a selection control register 81 reset in response to the error detection signal ED and a selector 82 responsive to the error address signal EAD. More particularly, the selection control register 81 is enabled each time when an indication signal IND is given from the error detection controller 32. The selection control register 81 sends a content of the selection control register 81 as selection control signals C0, C1, and C2 to the selector 82 and to an adder 83. The adder 83 adds unity to the content of the selection control register 81 each time on reception of the indication signal IND. The content of the selection control register 81 is therefore successively counted up by +1.

The selector 82 is coupled to two adder circuits 86 and 87 and two subtracter circuits 88 and 89 which are supplied with the error address signal EAD. The adder circuits 86 and 87 add +1 (kB) and +3 (kB) to the error address specified by the error address signal EAD to produce first and second sum addresses which may be called first and second addresses, respectively, while the subtracter circuits 88 and 89 subtract 1 (kB) and 3 (kB) from the error address to produce first and second subtraction addresses which may be referred to as first and second subsidiary signals, respectively. The first and the second sum addresses and the first and the second subtraction addresses are sent to the selector 82 and are selected by the selection control signals C0, C1, and C2 to be delivered as a selected address to the diagnostic address register 91 which is enabled either by the error detection signal ED or by the indication signal IND.

With this structure, the selection control register 81 is reset in response to the error detection signal ED which is representative of an occurrence of an error in the main memory 11. Consequently, the selection control signals C0, C1, and C2 are turned into (0, 0, 0). In this event, the error address signal EAD is selected by the selector 82 to be sent through the diagnostic address register 91 to the error detection controller 32.

Thereafter, the content of the selection control register 81 is turned into (0, 0, 1) in response to the indication signal IND sent from the error detection controller 32 and is sent as the selection control signals C0, C1, and C2 to the selector 82. Under the circumstances, the selector 82 selects the first sum address sent from the address circuit 886 and supplies the first sum address to the error detection controller 32 through the diagnostic address register 91.

Next, the second sum address is selected by the selector 82 when the selection control signals C0, C1, and C2 are turned into (0, 1, 0) in response to the indication signal IND and is delivered to the error detection controller 32 through the diagnostic address register 91.

Subsequently, when the selection control signals C0, C1, and C2 are changed to (0, 1, 1) in response to the indication signal IND, the first substraction address is selected by the selector 82 and sent through the diagnostic address register 91 to the error detection controller 32. Likewise, the second subtraction address is selected by the selector 82 and sent through the diagnostic address register 91 when the selection control signals C0, C1, and C2 take (1, 0, 0).

In the example being illustrated, the selection control signals C0, C1, and C2 are also sent to the error detection controller 32 to inform the error detection controller 32 of an access operation carried out by the use of either one of the diagnostic address signals, namely, either one of the error address signal, the first and the second sum address signals, and the first and the second subtraction address signals. The selection control signals C0, C1, and C2 are used to control reconstruction of the main memory 11 in the error detection controller 32.

Figure 6:
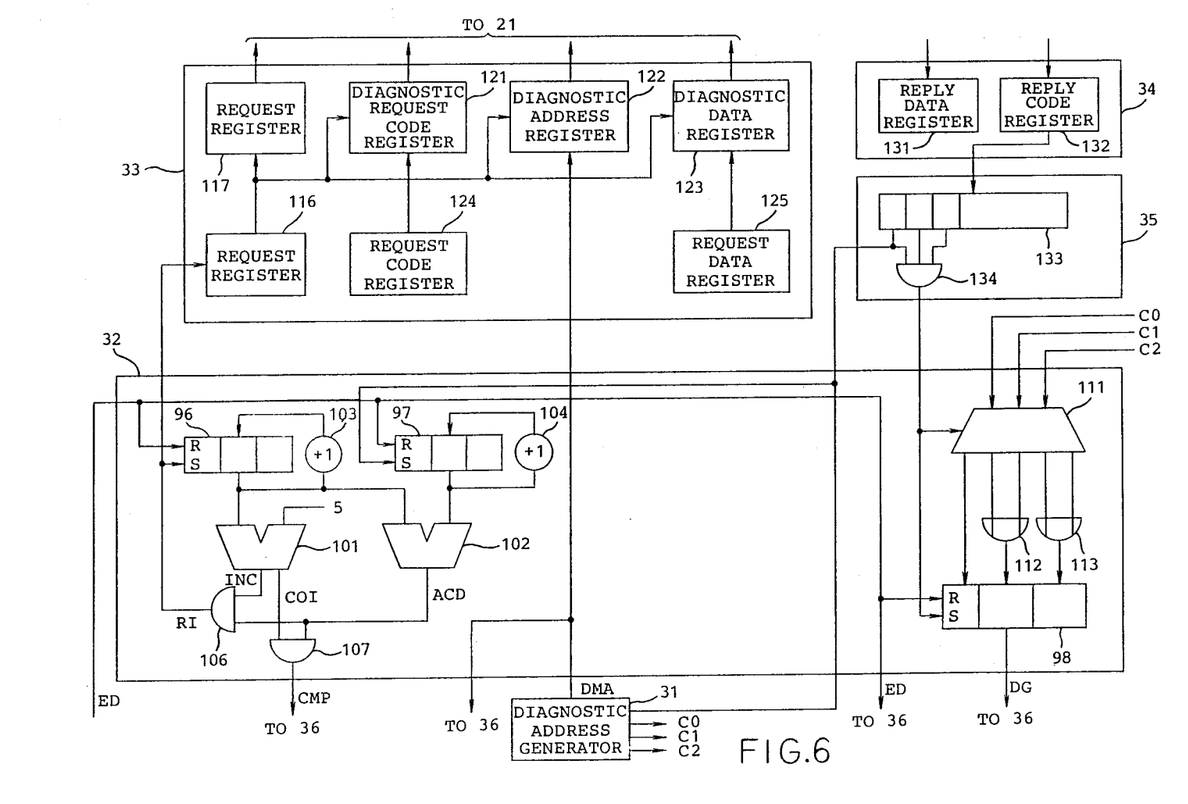
FIG. 6 is a block diagram of another part of the diagnostic processor that is specified by an error detection controller and an error identification circuit both of which in FIG. 1.

Referring to FIG. 6, the error detection controller 32 is shown in detail and is coupled to the diagnostic address generator 31, the diagnostic request controller 33, the diagnostic reply controller 34, and the error identification circuit 35.

The error detection controller 33 is supplied with the error detection signal ED from the error informing circuit 28 (FIGS. 1 and 5). The error detection signal ED is also supplied through the error detection controller 33 to the memory restructuring circuit 36.

The error detection controller 33 comprises first and second counters 96 and 97 and a diagnostic result register 98 which are all reset in response to the error detection signal ED. The first counter 96 supplies a first comparator 101 and a second comparator 102 with a first output signal of three bits. The first output signal is counted up by +1 in an adder 103 and is given to the first counter 101 again.

The first output signal of the first counter 96 is compared with a preselected number of five by the first comparator 101. The first comparator 101 produces an incoincidence signal INC of the logic "1" level when the first output signal is incoincident with the preselected number. On the other hand, the first comparator 101 produces a coincidence signal COI of the logic "1" level when the first produces a coincidence signal COI of the logic "1" level when the first output signal specifies the preselected number of five. This shows that the coincidence signal COI appears only when diagnostic access operations are carried out five times, as will later be described.

The second counter 97 is enabled in a manner to be described each time when a reply is returned back to the error identification circuit 35 from the main memory 11. The second counter 97 supplies the second comparator 102 with a second output signal of three bits counted up by +1 in an adder 104 each time on reception of the reply. The second comparator 102 compares the second output signal with the first output signal to produce an additional coincidence signal ACO of the logic "1" level when the first output signal is coincident with the second output signal. The additional coincidence signal ACO of the second comparator 102 shows that the number of diagnostic requests is equal to the number of diagnostic replies.

Responsive to the incoincidence signal INC and the additional coincidence signal ACO, a first AND circuit 106 produces a request indication signal RI for indicating a following request. The request indication signal RI is sent to the first counter 96 so as to count up the first counter 96.

Supplied with the additional coincidence signal ACO and the coincidence signal COI, a second AND circuit 107 produces a completion signal CMP which is representative of completion of the diagnostic operation and which is sent to the memory restructuring circuit 36.

As shown in FIG. 6, the selection control signals C0, C1, and C2 are sent to the diagnostic address generator 31 to a decoder 111 which controlled by the error identification circuit 35 and which is connected through a pair of OR circuits 112 and 113 to the diagnostic result register 98.

Description will now be made about the operation of the diagnostic processor 16.

Supplied with the error detection signal ED from the error informing circuit 28, the first and the second counters 96 and 97 and the diagnostic result register 98 are put into reset states. Under the circumstances, the request indication signal RI is delivered from the first AND circuit 106 to the first counter 96 and a request transmission control register 116. As a result, the first counter 96 is counted up to unity and the request transmission control register 116 supplies a request transmission indication to the request/reply controller 21 (FIG. 1) through a request register 117. Simultaneously, a diagnostic request code, a diagnostic address signal, and a diagnostic data signal are stored in a diagnostic request code register 121, a diagnostic address register 122, and a diagnostic data register 123, respectively. In this case, the diagnostic address signal is sent from the diagnostic address generator 31 through the error detection controller 32 in the above-mentioned manner. On the other hand, the diagnostic request code and the diagnostic data signal are supplied from a request code register 125 and a request data register 125 to the diagnostic request code register 121 and the diagnostic data register 123, respectively. In this situation, the following request is suppressed because no request indication signal RI is produced from the first AND circuit 106.

After the diagnostic access operation is carried out, the diagnostic reply controller 34 is supplied with a diagnostic data signal and a diagnostic reply code. In the diagnostic reply controller 34, the diagnostic data signal and the diagnostic reply code are loaded with a reply data register 131 and a reply code register 132, respectively. The diagnostic reply code is transferred from the reply code register 132 to an additional reply code register 133 of the error identification circuit 35. The diagnostic reply code is composed of zeroth through sixth bits as shown in FIG. 3. The zeroth through the second bits of the diagnostic reply code are sent to an AND gate 134 which is operable to detect whether or not an error results from a malfunction of the main memory 11. The zeroth bit of the diagnostic reply code is also sent to the diagnostic address generator 31 and to the second counter 97. Inasmuch as the zeroth bit of the diagnostic reply code takes the logic "1" level in the reply code, as mentioned in conjunction with FIG. 3, the second counter 97 is counted up by +1. In addition, the diagnostic address signal is renewed by the diagnostic address generator 31 in the manner mentioned in conjunction with FIG. 5.

When the second counter 97 is counted up by +1 in response to the zeroth bit of the diagnostic reply code, the reply indication signal RI is sent from the first AND circuit 106 to both the first counter 96 and the request transmission control register 116. This is because the first output signal of the first counter 96 is coincident with the second output signal of the second counter 97 and the first output signal is incoincident with the preselected number of five. The first counter 96 is counted up in response to the reply indication signal RI and the request transmission control register 116 sends the request transmission indication to the request register 117. As a result, a following one of the diagnostic address signals is produced from the diagnostic address generator 31 and is kept in the diagnostic address register 122. Thereafter, diagnostic access operation is carried out by the use of the following diagnostic address signal in a manner similar to that described above.

Thus, the diagnostic address register 122 is successively loaded with the diagnostic address signals and the diagnostic access operations are carried out five times. After a fifth or last one of the diagnostic memory access operations is completed, the completion signal CMP is sent through the second AND gate 107 to the memory restructuring circuit 36.

When an error, namely, a diagnostic error takes place in the main memory 11, the AND gate 134 of the error identification circuit 35 produces a memory error signal of the logic "1" level representative of detection of the error in the main memory 11. The memory error signal is delivered to both the decoder 111 and the diagnostic result register 98. As a result, the decoder 111 is enabled each time on detection of the memory error signal and decodes the selection control signals C0, C1, and C2 sent from the diagnostic address generator 31. The decoder 111 produces a decoded signal representative of either one of the diagnostic access operations that uses either one of the diagnostic address signals. The decoded signal is encoded through the OR circuits 112 and 113 into an encoded signal of three bits to be stored into the diagnostic result register 98 having zeroth through second bits.

The zeroth bit of the diagnostic result register 98 is loaded with the logic "1" level when an error occurs in a preselected address on an access operation of the source request processor 15 and is detected again in the preselected address on the diagnostic access operation of the diagnostic processor 16. Likewise, the first bit of the diagnostic result register 98 is loaded with the logic "1" level when an error is detected on accessing the first sum address and the first subtraction address on the diagnostic access operation. In addition, the second bit of the diagnostic result register 98 is given the logic "1" level when an error is detected on accessing the second sum address and the second subtraction address on the diagnostic access operations. Anyway, a result of diagnosis is produced from the diagnostic result register 98 as a diagnostic result signal DG.

Figure 7:
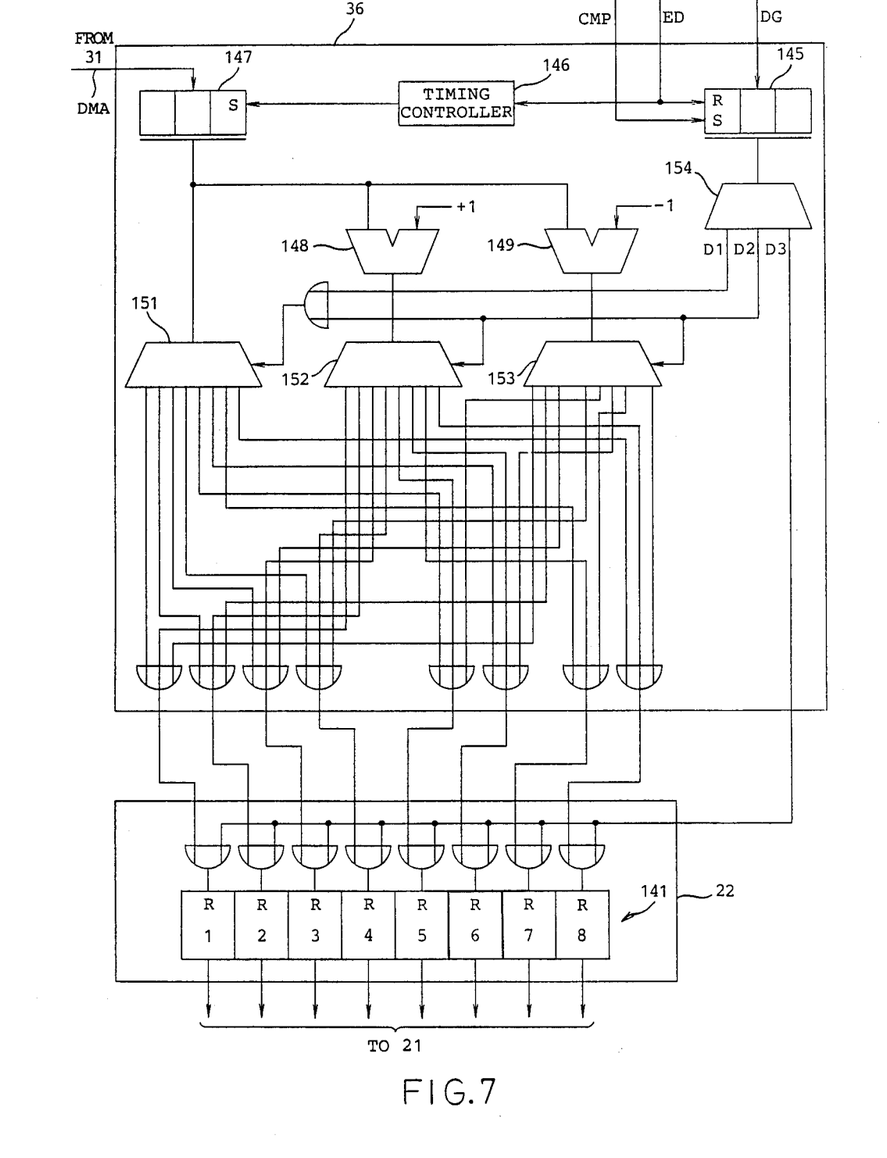
FIG. 7 shows a block diagram of a further part of the diagnostic processor with a part of a memory access control device illustrated in FIG. 1.

Referring to FIG. 7, the memory restructuring circuit 36 of the diagnostic processor 16 is illustrated in detail together with the memory formation controller 22 of the memory access control device 13. In FIG. 7, the memory formation controller 22 is specified by a formation control section 141 comprising first through eighth registers which are depicted at 1 to 8 and which correspond to the first through eighth memory units 111 to 118, respectively. The first through eighth registers serve to separate the respective memory units 111 to 118 when they are reset through OR gates (unnumbered).

Now, the illustrated memory restructuring circuit 36 is operable in response to the error detection signal ED, the completion signal CMP, the diagnostic address signal DMA, and the diagnostic result signal DG to supply the formation control section 141 with reset signals as a memory instructing signal. More particularly, the memory restructuring circuit 36 comprises a diagnosis result register 145 reset in response to the error detection signal ED sent from the error informing circuit 28 through the error detection controller 32. The error detection signal ED is also sent to a timing controller 146 coupled to a unit number storage 147. The unit number storage 147 is supplied with a preselected number for a preselected unit number indicated by a preselected one of the diagnostic address signals DMA from the diagnostic address generator 31 through the error detection controller 32. The preselected number of the diagnostic address signals DMA specifies a preselected one of the first through eighth memory units 111 to 118 and is continuously kept in the unit number storage 147 under control of the timing controller 146.

The preselected unit number kept in the unit number storage 147 is supplied as a preselected unit number signal to first and second adder units 148 and 149. The first and the second adder units 148 and 149 add ±1 and −1 to the preselected number stored in the unit number storage 147 and produce first and second unit number signals specifying first and second unit numbers displaced from the preselected unit number by ±1 and −1, respectively.

The preselected unit number signal and the first and the second unit number signals are sent to first, second, and third decoders 151, 152, and 153 which are put into an active state in a manner to be presently described.

When the diagnostic access operations are carried out five times, the completion signal CMP is sent from the error detection controller 32 to the diagnosis result register 145. In this event, the diagnostic result signal DG is assumed to be sent to the diagnosis result register 145 with the error detection signal ED received. In this situation, the diagnostic result signal DG is decoded by a fourth decoder 154 into first, second, and third decoded signals D1, D2, and D3.

The first decode signal D1 is produced when the diagnostic result signal DG takes a first pattern of "100," namely, when an error occurs only in the preselected address on the diagnostic access operations. The second decoded signal D2 is produced when the diagnostic result signal DG takes a second pattern of "110," namely, when errors are detected in the preselected address, the first sum address, and the first subtraction address during the diagnostic access operations. The third decoded signal D3 is produced when the diagnostic result signal DG takes a third pattern of "111," namely, when errors are detected in all of the preselected address, the first and the second sum addresses, and the first and the second subtraction addresses.

Enabled by the first or the second decoded signal D1 or D2, the first decoder 151 decodes the preselected unit number to supply the reset signal to a preselected one of the registers of the formation control section 141 that corresponds to the preselected memory unit having the preselected unit number. The reset signal is delivered to the preselected register through a reset circuit formed by logic elements.

The second decoder 152 is enabled by the second decoded signal D2 to decode the first unit number signal to separate the memory unit of the first unit number. Likewise, the third decoder 153 is enabled by the second decoded signal to decode the second unit number signal to separate the memory unit of the second unit number.

The third decoded signal D3 is delivered through the unnumbered OR gates of the memory formation controller 22 to all of the registers of the formation control section 141. Accordingly, all of the registers of the formation control section 141 are reset in response to the third decoded signal D3 and are separated from the system. This means that the common control section 19 of the main memory 11 is regarded as being faulty when errors are detected in the second sum address and the second subtraction address also and that all of the memory units are invalidated in the illustrated example. The third decoded signal D3 and output signals of OR gates (unnumbered) of the memory restructuring circuit 36 may be made to correspond to the restructuring control signal RS (FIG. 1).

A plurality of request source processors may be included in the processor section 12 and the processors may be included in the processor section 12 and the diagnostic processor 16 may be used in common to the plurality of request source processors. Alternatively, the diagnostic processor 16 may be included in a predetermined one or ones of the request source processors.

While this invention has thus far been described in conjunction with a preferred embodiment thereof, it will readily be possible for those skilled in the art to put this invention into practice in various other manners. For example, each of the memory units of the main memory 11 may be divided into a plurality of zones each of which may be disconnected or isolated in the manner mentioned in conjunction with FIG. 7.

What is claimed is:

1. An information processing system comprising a main memory which has a plurality of addresses and which is accessible by a processor by an access operation carried out in said processor with a preselected address selected from said addresses during said access operation, said information processing system being operable to diagnose an error which might result in said main memory from said access operation, said processor comprising detecting means for detecting occurrence of said error to produce an error signal representative of said occurrence of the error and memory address storage means coupled to said detecting means for memorizing the preselected address on said occurrence of the error, wherein the improvement comprises:

address producing means operable on said occurrence of the error and coupled to said detecting means and said memory address storage means for producing not only said preselected address but also an additional address of the addresses that is different from said preselected address to access both said preselected address and said additional address;

receiving means for receiving access results of accessing said preselected and said additional addresses;

judging means coupled to said receiving means for judging a faulty portion and a normal portion of said main memory in response to said access results to produce a result of judgment; and memory restructuring means coupled to said judging means for restructuring said main memory in response to said result of judgment by isolating said faulty portion from said normal portion.

2. An information processing system as claimed in claim 1, said main memory comprising first through n-th memory units which have predetermined numbers of said addresses, respectively, consecutively numbered from said first memory unit to said n-th memory unit, where n is an integer greater than unity, wherein said preselected address specifies a preselected one of said first through n-th memory units while said additional address specifies an additional one of said first through n-th memory units that is different from said preselected one of the first through n-th memory units.

3. An information processing system as claimed in claim 2, wherein said address producing means produces a subsidiary address for specifying a subsidiary one of said first through n-th memory units that is different from said preselected and said additional ones of the memory units.

4. An information processing system as claimed in claim 3, wherein said address producing means further produces a plurality of local addresses for specifying local ones of said first through n-th memory units that are different from said preselected, said additional, and said subsidiary ones of the memory units.

5. An information processing system as claimed in claim 1, further comprising:
 error discriminating means operable on said occurrence of the error and coupled to said judging means for discriminating whether or not the error is caused by said main memory to inform said judging means of said occurrence of the error.

6. An information processing system comprising a main memory having a plurality of addresses, a plurality of processors each of which is accessible to said main memory by carrying out an access operation with a preselected one of said memory addresses indicated, and an access control device intermediate between said main memory and said processors for controlling said access operation of each of said processors, said main memory comprising a plurality of memory units which can be accessed independently of one another and a common control section coupled to said memory units and said access control device for controlling said plurality of the memory units in common, said preselected memory address being located at a preselected one of said memory units, each of said processors being operable as a request source processor and comprising detecting means for detecting occurrence of an error which might occur on the access operation of each of said processors, error detection signal producing means coupled to said detecting means for producing an error detection signal representative of occurrence of said error, and memory address storage means coupled to said detecting means for storing the preselected one of the memory addresses on occurrence of the error, wherein the improvement comprises:
 diagnostic address producing means coupled to said error detection signal producing means and said memory address storage means and responsive to said error detection signal for producing a plurality of diagnostic address signals specifying said preselected memory address and at least one additional memory address which is determined in relation to said preselected memory address and which is present in a different one of said memory units from the preselected one of said memory units;
 memory access means operable on the occurrence of said error and coupled to said diagnostic address producing means for accessing said main memory by the use of said plurality of the diagnostic address signals to make said main memory produce diagnostic results of accessing said main memory by the use of said diagnostic address signals;
 identifying means responsive to said diagnostic results for identifying a diagnostic error in said diagnostic results to discriminate whether or not the diagnostic error is caused by said main memory;
 judging means coupled to said error detection signal producing means, said diagnostic address producing means, and said identifying means for judging whether said diagnostic error is caused either by said common control section or by any of said memory units accessed by said diagnostic address signals when said diagnostic error is caused by said main memory to produce a result of judgment; and
 memory restructuring means coupled to said judging means for restructuring said memory units in response to said result of judgment.

* * * * *